(12) United States Patent
Mahmood

(10) Patent No.: US 11,994,560 B1
(45) Date of Patent: May 28, 2024

(54) RELAY MONITORING FOR ELECTRICAL SYSTEMS

(71) Applicant: Rivian IP Holdings, LLC, Plymouth, MI (US)

(72) Inventor: Muhammad Mobeen Mahmood, Irving, TX (US)

(73) Assignee: Rivian IP Holdings, LLC, Irvine, CA (US)

( * ) Notice: Subject to any disclaimer, the term of this patent is extended or adjusted under 35 U.S.C. 154(b) by 0 days.

(21) Appl. No.: 18/185,279

(22) Filed: Mar. 16, 2023

(51) Int. Cl.
*G01R 31/327* (2006.01)
*G01R 19/00* (2006.01)

(52) U.S. Cl.
CPC ..... *G01R 31/3278* (2013.01); *G01R 19/0038* (2013.01)

(58) Field of Classification Search
CPC .......... G01R 31/3278; G01R 19/0038
See application file for complete search history.

(56) References Cited

U.S. PATENT DOCUMENTS

| | | | | |
|---|---|---|---|---|
| 5,754,114 | A | * 5/1998 | Gnadt | H02H 11/001 340/649 |
| 9,350,175 | B2 | 5/2016 | Subramanium et al. | |
| 9,711,309 | B2 | 7/2017 | McCormick et al. | |
| 11,486,929 | B1 | * 11/2022 | Curtis | G01R 31/3278 |
| 2014/0098842 | A1 | * 4/2014 | White, III | H04L 12/12 307/1 |
| 2018/0315565 | A1 | * 11/2018 | Zhang | H01H 47/002 |
| 2020/0011929 | A1 | * 1/2020 | Wang | B60L 3/0046 |
| 2021/0053460 | A1 | * 2/2021 | Oh | B60L 1/006 |

* cited by examiner

*Primary Examiner* — Feba Pothen
(74) *Attorney, Agent, or Firm* — BAKERHOSTETLER

(57) ABSTRACT

Aspects of the disclosure relate to relay monitoring for electrical systems. An electrical system may include one or more relays, such as steering relays, that switchably couple separate portions of the electrical system. By exercising the relay(s) and measuring voltages on opposite sides of the relay, it may be determined whether the relay is healthy.

20 Claims, 9 Drawing Sheets

RELAY MONITORING FOR ELECTRICAL SYSTEMS

INTRODUCTION

Electrical systems often include relays that are controllable to switchably couple various parts of the electrical system.

Aspects of the subject technology can help to improve the reliability and/or serviceability of electric vehicles, which can help to mitigate climate change by reducing greenhouse gas emissions.

SUMMARY

The present description relates generally to verifying relay health in an electrical system in which one or more relays are configured to switch between, and provide galvanic isolation between, a power source terminal (e.g., for an electrical grid, such as for charging a battery of the electrical system) and a load terminal of the electrical system. The load terminal can include an electrical outlet and/or one or more terminals coupled to one or more respective electrical loads. The electrical system may be implemented in a vehicle.

In accordance with one or more aspects of the disclosure, an apparatus is provided that includes an electrical system. The electrical system may include a relay having a pole that is coupled to power electronics of the apparatus and that is switchably couplable to: a first contact that is coupled to a power source terminal, and a second contact that is coupled to a load terminal. The apparatus may also include control circuitry configured to: exercise the relay to connect the pole to the first contact; determine that a first voltage at the first contact of the relay is equal to a second voltage at the pole of the relay; exercise the relay to connect the pole to the second contact; obtain a third voltage at the second contact of the relay and a fourth voltage at the pole of the relay; and determine whether the relay has a fault based on a comparison of the third voltage and the fourth voltage.

The power source terminal may be coupled to a power source external to the apparatus. The power source external to the apparatus may include an electrical grid. The load terminal may include an electrical outlet. The apparatus may include a vehicle. The control circuitry may be configured to determine whether the relay has a fault by determining, based on the comparison, that the third voltage is different from the fourth voltage; and determining that the relay has the fault based on the determination that the third voltage is different from the fourth voltage. The control circuitry may be configured to determine whether the relay has a fault by determining, based on the comparison, that the third voltage is substantially the same as the fourth voltage; and determining that the relay is healthy based on the determination that the third voltage is substantially the same as the fourth voltage.

The apparatus may also include at least one additional relay having a pole coupled to the power electronics, wherein the at least one additional relay is switchable between: an open position, and a closed position in which the pole is connected to a contact of the at least one additional relay, wherein the contact of the at least one additional relay is coupled to the load terminal. The control circuitry may also be configured to: open the at least one additional relay; and determine whether the at least one additional relay has a fault based on a comparison of a fifth voltage at the pole of the at least one additional relay and a sixth voltage at the contact of the at least one additional relay. The control circuitry may be configured to determine whether the at least one additional relay has a fault by: determining that the fifth voltage is substantially the same as the sixth voltage; and determining that the at least one additional relay has the fault based on the determination that the fifth voltage is substantially the same as the sixth voltage. The control circuitry may be configured to determine whether the at least one additional relay has a fault by: determining that the fifth voltage is different from the sixth voltage; and determining that the at least one additional relay is healthy based on the determination that the fifth voltage is different from the sixth voltage. The control circuitry may be configured to determine whether the at least one additional relay has the fault based on a comparison of a seventh voltage at the pole of the at least one additional relay and an eighth voltage at the contact of the at least one additional relay, the comparison performed while the relay is exercised to the second contact of the relay.

In accordance with one or more other aspects of the disclosure, a method is provided that includes: exercising a relay of an electrical system to connect a pole of the relay to a first contact of the relay; determining that a first voltage at the first contact of the relay is equal to a second voltage at the pole of the relay; exercising the relay to connect the pole to a second contact of the relay; obtaining a third voltage at the second contact of the relay and a fourth voltage at the pole of the relay; and determining whether the relay has a fault based on a comparison of the third voltage and the fourth voltage.

Determining whether the relay has the fault may include determining, based on the comparison, that the third voltage is different from the fourth voltage; and determining that the relay has the fault based on the determination that the third voltage is different from the fourth voltage. The method may also include providing a notification responsive to determining that the relay has the fault based on the comparison of the third voltage and the fourth voltage.

Determining whether the relay has a fault may include determining, based on the comparison, that the third voltage is substantially the same as the fourth voltage; and determining that the relay is healthy based on the determination that the third voltage is substantially the same as the fourth voltage. The method may also include providing power from a battery to a load terminal of the electrical system via the relay responsive to determining that the relay is healthy.

The method may also include opening at least one additional relay of the electrical system; and determining whether the at least one additional relay has a fault based on a comparison of a fifth voltage at a pole of the at least one additional relay and a sixth voltage at a contact of the at least one additional relay. The method may also include determining whether the at least one additional relay has the fault based on a comparison of a seventh voltage at the pole of the at least one additional relay and an eighth voltage at the contact of the at least one additional relay, the comparison performed while the relay is exercised to the second contact of the relay.

In accordance with one or more other aspects of the disclosure, an electric vehicle is provided that includes a relay having a pole that is coupled to power electronics of the electric vehicle and that is switchably couplable to: a first contact that is coupled to a power source terminal, and a second contact that is coupled to a load terminal. The electric vehicle may also include control circuitry configured to: exercise the relay to connect the pole to the first contact; determine that a first voltage at the first contact of the relay is equal to a second voltage at the pole of the relay; exercise the relay to connect the pole to the second contact; obtain a third voltage at the second contact of the relay and a fourth voltage at the pole of the relay; and determine whether the relay has a fault based on a comparison of the third voltage and the fourth voltage. The power source terminal may be coupled to a power source external to the electric vehicle, and the load terminal include an electrical outlet of the electric vehicle.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, the subject technology is not limited to the specific details set forth herein and can be practiced using one or more other implementations. In one or more implementations, structures and components are shown in block diagram form in order to avoid obscuring the concepts of the subject technology.

Aspects of the subject technology described herein relate to monitoring of the health of one or more relays, such as steering relays, in an electrical system. In one or more implementations, the electrical system may be implemented in an apparatus such as a vehicle (e.g., an electric vehicle).

Figure 1A:
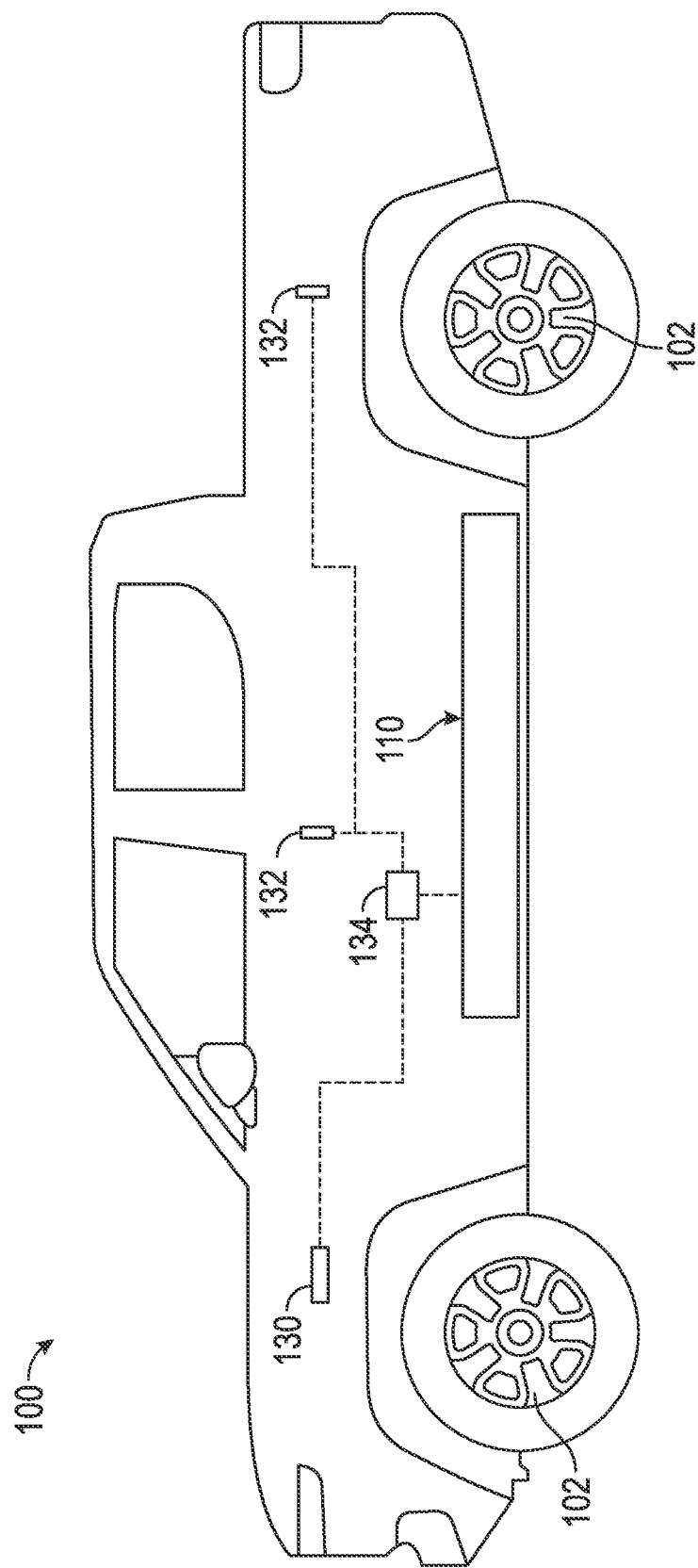
FIGS. 1A and 1B illustrate side views of example implementations of a vehicle having an electrical system including a relay in accordance with one or more implementations.

FIG. 1A is a diagram illustrating an example implementation of an apparatus as described herein. In the example of FIG. 1A, the apparatus is a moveable apparatus implemented as a vehicle 100. As shown, the vehicle 100 may include one or more batteries 110. The battery 110 may be coupled to an electrical system of the vehicle 100, to receive power for charging of the battery and/or to provide power to one or more load terminals and/or electrical loads coupled to the electrical system.

In one or more implementations, the vehicle 100 may be an electric vehicle having one or more electric motors that drive the wheels 102 of the vehicle using electric power from the battery 110. In one or more implementations, the vehicle 100 may also, or alternatively, include one or more chemically-powered engines, such as a gas-powered engine or a fuel cell powered motor. For example, electric vehicles can be fully electric or partially electric (e.g., hybrid or plug-in hybrid). In various implementations, the vehicle 100 may be a fully autonomous vehicle that can navigate roadways without a human operator or driver, a partially autonomous vehicle that can navigate some roadways without a human operator or driver or that can navigate roadways with the supervision of a human operator, may be an unmanned vehicle that can navigate roadways or other pathways without any human occupants, or may be a human operated (non-autonomous) vehicle configured for a human operator.

In the example of FIG. 1A, the vehicle 100 is implemented as a truck (e.g., a pickup truck) having a battery 110. The battery 110 may include on or more battery modules, which may include one or more battery cells, or may be provided without any battery modules (e.g., in a cell-to-pack configuration).

As shown, the battery 110 may include or be electrically coupled to an electrical system that may include a charging port 130 and/or one or more electrical outlets 132. The electrical system may also include control circuitry 134. The control circuitry 134 may switchably couple the battery 110 to the charging port 130 (e.g., for charging the battery when the charging port 130 is connected to an external power source, such as an electrical grid or an external battery) and to the electrical outlets 132 (e.g., for providing direct-current (DC) or alternating-current (AC) power to the electrical outlets 132). As described in further detail hereinafter, the control circuitry 134 may include one or more relays (e.g., steering relays) that are controllable by the control circuitry 134 for switchably coupling the battery 110 between the charging port 130 and the electrical outlets 132. In one or more implementations, the relays of the control circuitry 134 may provide galvanic isolation between the electrical outlets 132 and an external power source (e.g., an alternating current (AC) source) that may be coupled to the charging port 130.

In the example of FIG. 1A, the vehicle 100 includes two electrical outlets 132. For example, the two electrical outlets 132 may include an electrical outlet 132 in a cab or passenger area of the vehicle, and an electrical outlet 132 in a bed of the vehicle. However, this is merely illustrative, and the vehicle 100 may include one electrical outlet 132 or more than two electrical outlets 132. For example, the vehicle 100 may include one or more electrical outlets implemented as Universal Serial Bus (USB) ports, one or more electrical outlets implemented as 6 Volt or 12 Volt DC outlets having a center positive contact and a cylindrical negative contact, and/or one or more electrical outlets implemented as two-prong or three-prong wall-socket type AC electrical outlets that provide 110V, 120V, or 240V.

Figure 1B:
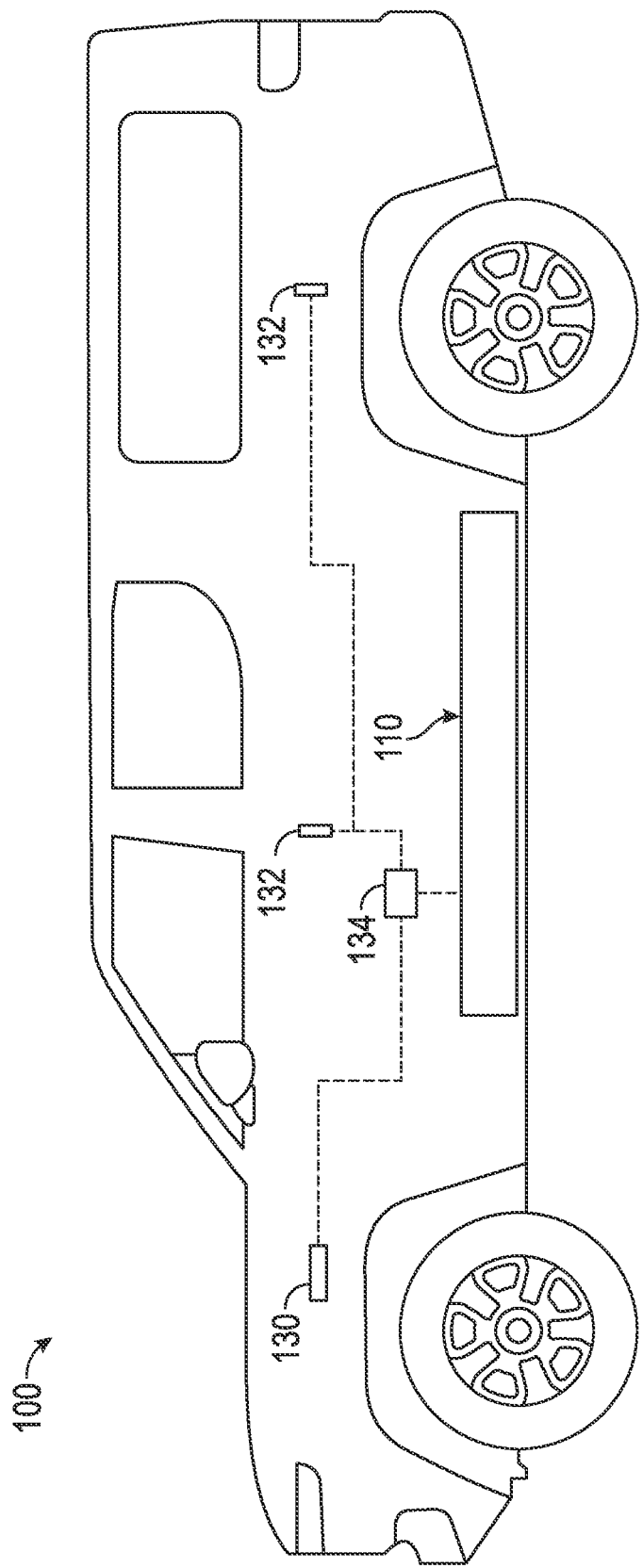

The example of FIG. 1A in which the vehicle 100 is implemented as a pickup truck having a truck bed is merely illustrative. For example, FIG. 1B illustrates another implementation in which the vehicle 100 including the battery 110, the charging port 130, the electrical outlets 132, and the control circuitry 134 is implemented as a sport utility vehicle (SUV), such as an electric sport utility vehicle. In the example of FIG. 1B, the vehicle 100 including the battery 110, the charging port 130, the electrical outlets 132, and the control circuitry 134 may include a cargo storage area in at least a rear portion of the vehicle that is enclosed within the vehicle 100 (e.g., behind a row of seats within a cabin of the vehicle). In other implementations, the vehicle 100 may implemented as another type of electric truck, an electric delivery van, an electric automobile, an electric car, an electric motorcycle, an electric scooter, an electric passenger vehicle, an electric passenger or commercial truck, a hybrid vehicle, or other vehicles such as sea or air transport vehicles, planes, helicopters, submarines, boats, or drones, and/or any other movable apparatus having a battery 110 (e.g., that powers the propulsion or drive components of the moveable apparatus) and an electrical system including the charging port 130, the electrical outlets 132, and the control circuitry 134.

Figure 1C:
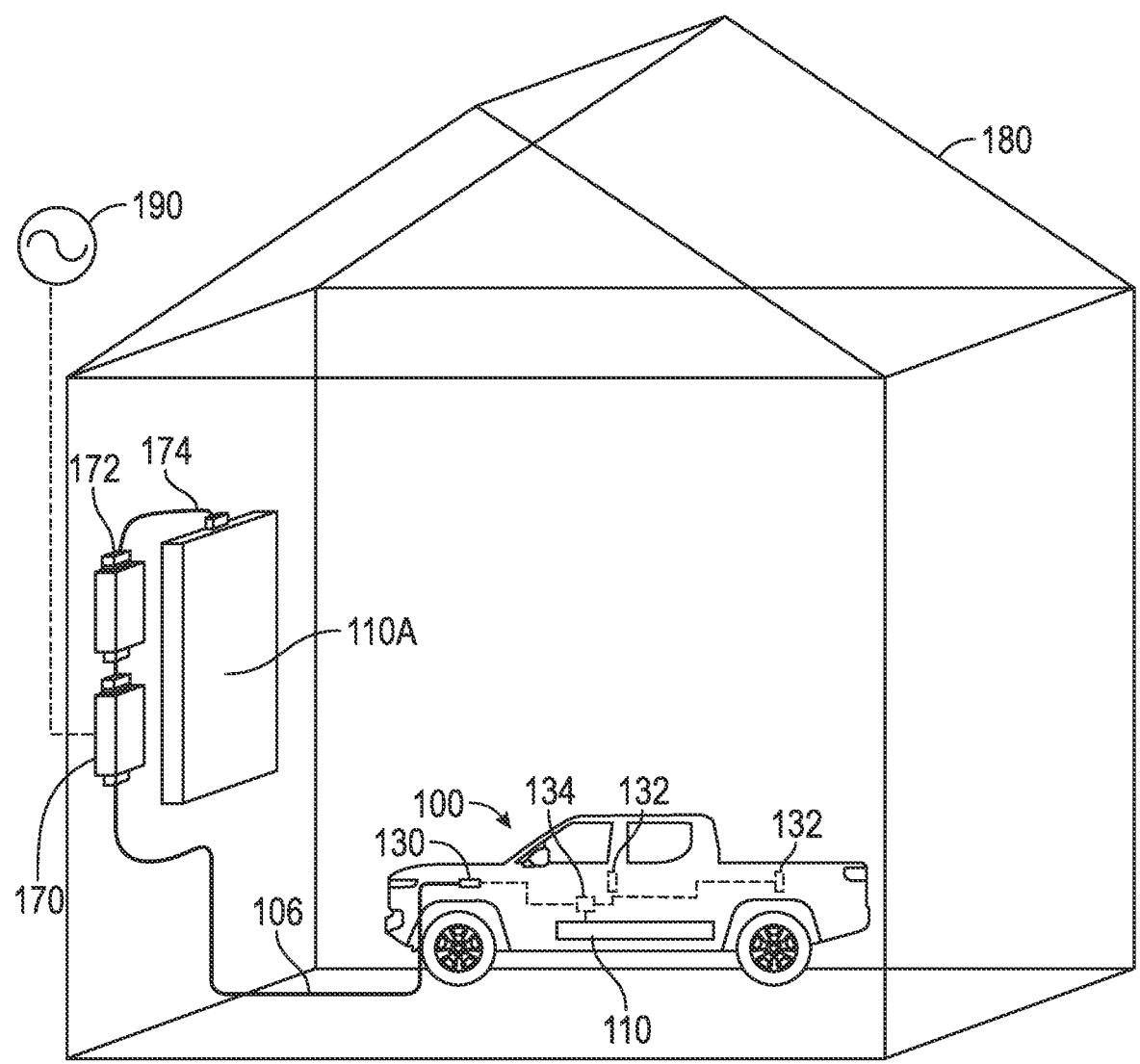
FIG. 1C illustrates a view of vehicle coupled to an electrical grid in accordance with one or more implementations.

In one or more implementations, an electrical system including a battery 110, a charging port 130, one or more electrical outlets 132, and control circuitry 134 may also, or alternatively, be implemented as an electrical power supply and/or energy storage system in another apparatus, such as a building (e.g., a residential home or commercial building). For example, FIG. 1C illustrates an example in which a battery 110A is implemented in a building 180. For example, the building 180 may be a residential building, a commercial building, or any other building. As shown, in one or more implementations, a battery 110A may be mounted to a wall of the building 180.

As shown, the battery 110A that is installed in the building 180 may be couplable to the battery 110 in the vehicle 100, such as via: a cable/connector 106 that can be connected to the charging port 130 of the vehicle 100, electric vehicle supply equipment 170 (EVSE), a power stage circuit 172, and a cable/connector 174. For example, the cable/connector 106 may be coupled to the EVSE 170, which may be coupled to the battery 110A via the power stage circuit 172, and/or may be coupled to an external power source 190. In this way, either the external power source 190 or the battery 110A that is installed in the building 180 may be used as an external power source to charge the battery 110 in the vehicle 100 in some use cases. In some examples, the battery 110A that is installed in the building 180 may also, or alternatively, be coupled (e.g., via a cable/connector 174, the power stage circuit 172, and the EVSE 170) to the external power source 190. For example, the external power source 190 may be a solar power source, a wind power source, and/or an electrical grid of a city, town, or other geographic region (e.g., electrical grid that is powered by a remote power plant). During, for example, times when the battery 110 in the vehicle 100 is not coupled to the battery 110A that is installed in the building 180, the battery 110A that is installed in the building 180 can be coupled (e.g., using the power stage circuit 172 for the building 180) to the external power source 190 to charge up and store electrical energy. In some cases, this stored electrical energy in the battery 110A that is installed in the building 180 can later be used to charge the battery 110 in the vehicle 100 (e.g., during times when solar power or wind power is not available, in the case of a regional or local power outage for the building 180, and/or during a period of high rates for access to the electrical grid).

In one or more implementations, the power stage circuit 172 may electrically couple the battery 110A that is installed in the building 180 to an electrical system of the building 180. For example, the power stage circuit 172 may convert DC power from the battery 110A into AC power for one or more loads in the building 180. For example, the battery 110A that is installed in the building 180 may be used to power one or more lights, lamps, appliances, fans, heaters, air conditioners, and/or any other electrical components or electrical loads in the building 180 (e.g., via one or more electrical outlets that are coupled to the battery 110A that is installed in the building 180). For example, the power stage circuit 172 may include control circuitry similar to the control circuitry 134 of the vehicle 100, that includes one or more relays that are operable to switchably couple the battery 110A between the external power source 190 and one or more electrical outlets and/or other electrical loads in the electrical system of the building 180. As will be discussed further below, the vehicle 100 may include a power stage circuit (not shown in FIG. 2) that can be used to convert power received from the electric vehicle supply equipment 170 to DC power that is used to power/charge the battery 110 of the vehicle 100, and/or to convert DC power from the battery 110 into AC power for the electrical outlets 132.

In one or more use cases, the battery 110A that is installed in the building 180 may be used as a source of electrical power for the building 180, such as during times when solar power or wind power is not available, in the case of a regional or local power outage for the building 180, and/or during a period of high rates for access to the electrical grid (as examples). In one or more other use cases, the battery 110 that is installed in the vehicle may be used to charge the battery 110A that is installed in the building 180 and/or to power the electrical system of the building 180 (e.g., in a use case in which the battery 110A that is installed in the building 180 is low on or out of stored energy and in which solar power or wind power is not available, a regional or local power outage occurs for the building 180, and/or a period of high rates for access to the electrical grid occurs (as examples)).

Figure 2:
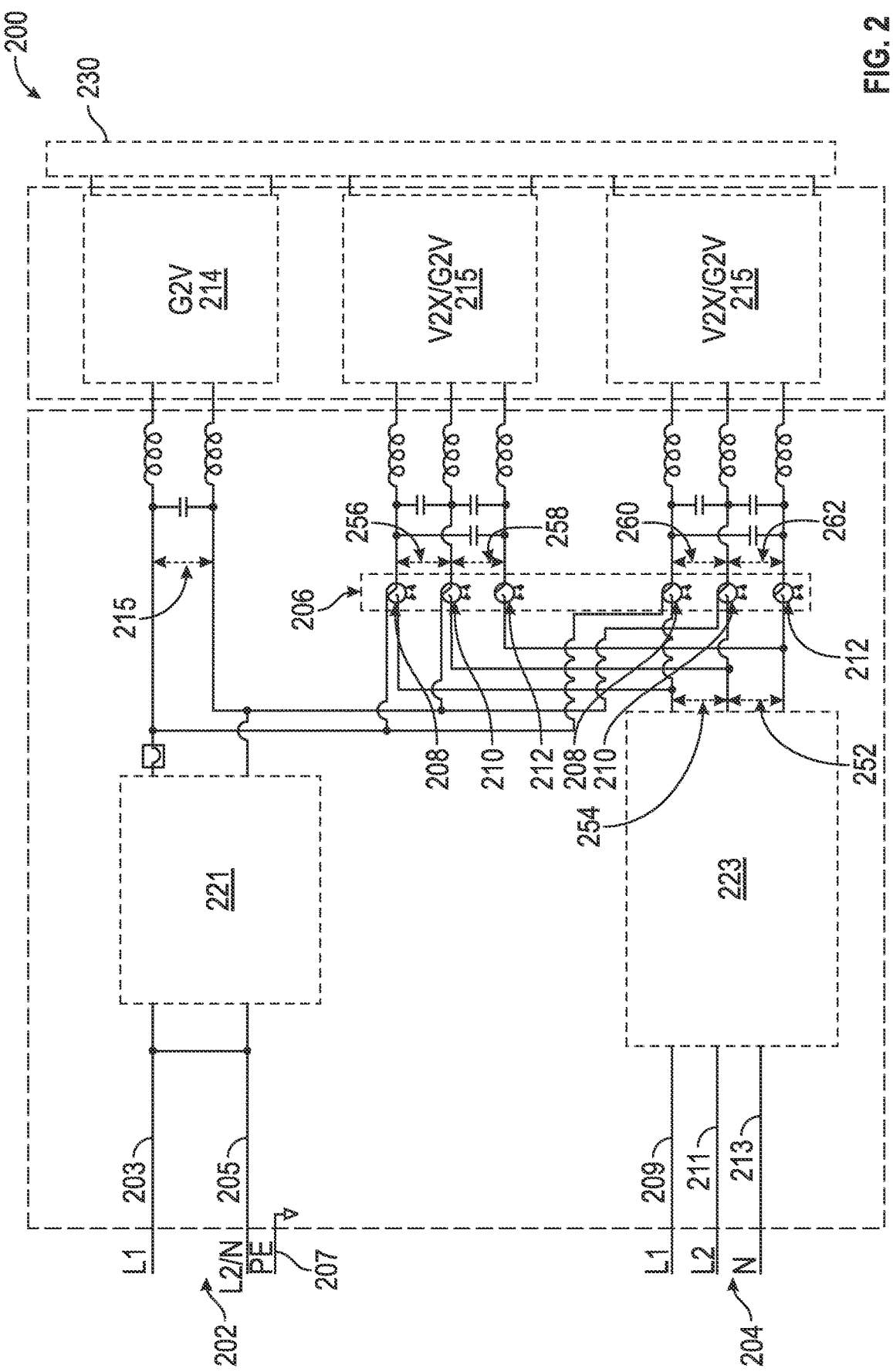
FIG. 2 illustrates a schematic diagram of an example electrical system in accordance with one or more implementations.

FIG. 2 depicts a portion of an example electrical system that may be implemented an apparatus such as the vehicle 100 of FIG. 1A, 1B, or 1C, and/or the building 180 of FIG. 1C. As shown in FIG. 2, an electrical system 200 may include a power source terminal 202 and a load terminal 204. For example, the power source terminal 202 may be an implementation of the charging port 130. For example, the load terminal 204 may be an implementation of one of the electrical outlets 132 of FIGS. 1A, 1B, and/or 1C, and/or any other outlet terminal that is coupled or couplable to an electrical load (e.g., a power consuming component or device). As shown, the electrical system 200 may be coupled to a power storage device 230 (e.g., an implementation of the battery 110).

As shown in FIG. 2, the electrical system 200 may include power electronics coupled between the power storage device 230 and the power source terminal 202 and between the power storage device 230 and the load terminal 204. For example, the power electronics of the electrical system 200 may include grid-to-vehicle (G2V) circuitry 214 that is electrically coupled to the power source terminal 202 (e.g., to a first line 203, such as an L1 voltage line and a second line 205, such as an L2/N voltage line) of the power source terminal 202. As shown, the power source terminal 202 may also include a protecting earthing (PE) or ground line 207. The power electronics of the electrical system 200 may also include a filter 221 (e.g., an electromagnetic interference (EMI) filter, such as an on-board charger (OBC) EMI filter) coupled between the G2V circuitry 214 and the power source terminal 202.

The power electronics of the electrical system 200 may also include vehicle-to-everything (V2X) and/or G2V circuitry 215. As shown, the V2X/G2V circuitry 215 may be switchably couplable, using a set of relays 206, between the power source terminal 202 and the load terminal 204 (e.g., a load terminal including a first line 209, such as an L1 voltage line, a second line 211, such as a L2 voltage line, and a third line 213, such as a neutral (N) line of the load terminal 204). The power electronics of the electrical system 200 may also include a filter 223 (e.g., an electromagnetic interference (EMI) filter, such as DCAC EMI filter) coupled between the V2X/G2V circuitry 215 and the load terminal 204. In the configuration of FIG. 2, the relays 206 may be operable to switch the electrical system 200 from between a G2V configuration and a vehicle-to-load (V2L) configuration.

In the example of FIG. 2, the electrical system 200 includes a first set of relays (e.g., including a relay 208, a relay 210, and a relay 212) coupled, in parallel, to first V2X/G2V circuitry 215, and a second set of relays (e.g., including a relay 208, a relay 210, and a relay 212) coupled, in parallel, to second V2X/G2V circuitry 215. In this example, each set of relays 206 includes two single pole double throw (SPDT) relays (e.g., relays 208 and 210) and one single pole single throw (SPST) relay (e.g., relays 212). In one or more other implementations, the electrical system 200 may include one set of relays and one V2X/G2V circuit, or more than two sets of relays and more than two V2X/G2V circuits, and/or one or more other sets of relays with other types and/or numbers of relays. In one or more implementations, the G2V circuitry 214 may be, or may be part of, an AC to DC conversion circuit that converts AC power from the power source terminal 202 to DC power for charging the power storage device 230. In one or more implementations, the V2X/G2V circuitry 215 may be, or may be part of, a DC to AC conversion circuit that converts DC power from the power storage device 230 to AC power for the power source terminal 202 and/or the load terminal 204.

If one or more of the relays 206 were to have a fault, such as being welded towards the grid side or the outlet side, then galvanic isolation between the power source terminal 202 and the load terminal 204 (e.g., between the electrical grid to the electrical outlets 132) may be compromised. If one or more of the relays 206 were to have a fault such as being welded towards the grid side or the outlet side, then galvanic isolation between the power source terminal 202 and the load terminal 204 (e.g., from the electrical grid to the electrical outlets 132) may be compromised. For at least these reasons, it can be advantageous to monitor the relays 206 for faults (e.g., to monitor the health of the relays 206), such as before energizing one or more parts of the electrical system 200.

In one or more implementations, auxiliary (aux) contacts can be provided to detect relay health (e.g., to determine whether any relay contacts are welded). For example, aux contacts may be mechanically coupled to the main contacts of a relay. However, SPDT relays are not typically provided with aux contacts.

Aspects of the subject technology can provide relay monitoring for electrical systems, such as without adding aux contacts for the relays. For example, as described in further detail hereinafter (e.g., in connection with FIGS. 3A-6), before starting power conversion using the electrical system 200, control circuitry (e.g., control circuitry 134 of FIGS. 1A, 1B, and/or 1C, which may include one or more of the components of the computing system 700 of FIG. 7) may steer an SPDT relay to the grid side. In this configuration, both the common and grid connected terminals of the relay should measure the grid voltage (or 0V if the electrical grid is not connected) if the relay is healthy. The control circuitry may then steer the SPDT relay to the inverter (outlet) side. A fault may be detected if the common and grid connected terminals of the relay measure the same voltage and the grid is connected. The control circuitry may then generate a voltage through inverter if the common and grid connected terminals of the relay measure different voltages or if the common terminal measures a zero voltage. In this configuration, both the outlet and common terminals of the relay should measure the inverter generated voltage. The control circuitry may then exercise the SPDT relay back toward the grid. In this configuration, the common and outlet connected terminals of the relay should measure different voltages if the relay is healthy.

In one or more implementations, an inverter neutral (N) leg SPST relay can also be monitored and/or diagnosed for faults. For example, the control circuitry may keep the SPST relay closed and measure L-L and L-N voltages on both sides of the SPST relay. If the L-L and L-N voltages on both sides of the SPST relay are the same, the control circuitry may open the inverter neutral (N) leg relay, and measure the voltages on the two sides of the inverter neutral (N) leg relay. In this configuration, a first side of the inverter neutral (N) leg relay should still measure inverter generated voltage for L1-L2 and L2-N, and the opposing second side of the inverter neutral (N) leg relay should only measure L1-L2, but not L2-N if the inverter neutral (N) leg relay is healthy. In various examples described hereinafter, voltages at various locations in the electrical system 200 may be measured (e.g., by control circuitry, such as the control circuitry 134 of FIGS. 1A, 1B, and/or 1C). As examples, voltages (e.g., voltage differences) may be measured at a location 250, a location 252, a location 254, a location 256, a location 258, a location 260, and/or a location 262, as described in further detail hereinafter.

Figure 3A:
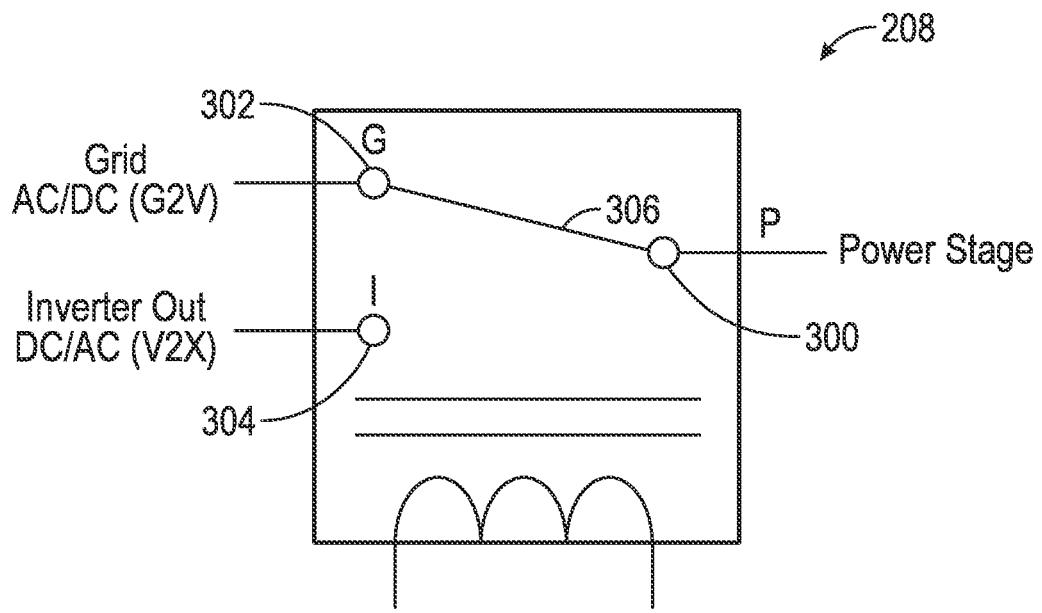
FIG. 3A illustrates a schematic diagram of an example relay in a first configuration for relay monitoring in accordance with one or more implementations.

FIGS. 3A, 3B, 4A, and 4B illustrate a relay 208 in various configurations and fault states that may occur during relay monitoring. As shown in FIG. 3A, a relay 208 may be implemented as a SPDT relay, and may have a pole 300, a first contact 302 (e.g., a first throw contact), a second contact 304 (e.g., a second throw contact), and a switching mechanism 306. The switching mechanism 306 may include an armature and/or a moveable contact that is actuatable between the configuration shown in FIG. 3A in which the switching mechanism 306 is in contact with the first contact 302 (to electrically coupled the pole 300 to the first contact 302), and a configuration in which the switching mechanism 306 is in contact with the second contact 304 (to electrically couple the pole 300 to the second contact 304). In one or more implementations, the relay 208 may include other components, such as a coil through which current can be passed to exercise the relay (e.g., actuate the switching mechanism 306) from one configuration to another. In various implementations, the first contact 302 may be a normally closed or normally open terminal, and the second contact 304 may be a normally open or normally closed terminal.

In one or more implementations (e.g., as in the example of FIG. 2 discussed above), the pole 300 may be coupled to power electronics (e.g., V2X/G2V circuitry 215) of an electrical system and/or an apparatus (e.g., the vehicle 100 or the building 180). In one or more implementations (e.g., as in the example of FIG. 2 discussed above), the first contact 302 may be coupled to a power source terminal 202 of the electrical system 200, and the second contact 304 may be coupled to a load terminal 204 or the electrical system 200.

In the example of FIG. 3A, a grid voltage (G), which may be non-zero if an external power source (e.g., external power source 190 of FIG. 1C, such as the electrical grid) is connected to the first contact 302 (e.g., if the vehicle is plugged in via the charging port 130) or zero if no external power source is connected (e.g., if the electric vehicle is unplugged). As shown, the second contact 304 may have an inverter voltage (I), which may be controllable by the control circuitry 134, and the pole 300 may have a pole voltage (P). The inverter voltage I and/or the pole voltage P may depend on the position of the switching mechanism 306. The pole voltage, P, may be generated by the V2X power stages by converting DC to AC.

Figure 3B:
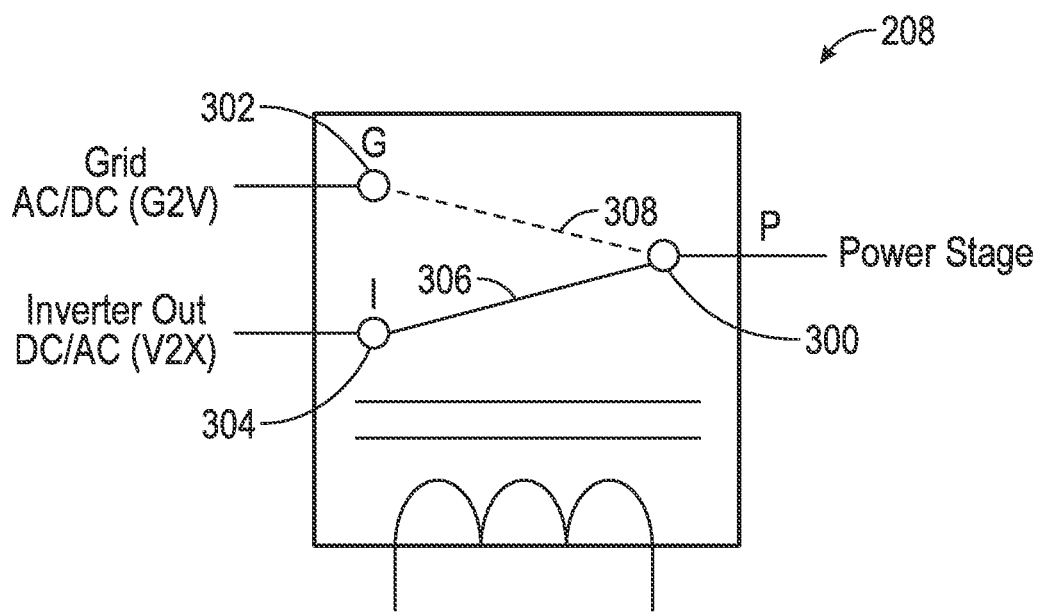
FIG. 3B illustrates a schematic diagram of the example relay of FIG. 3A in a fault state in accordance with one or more implementations.

In the example of FIG. 3A, in one use case, the control circuitry (e.g., control circuitry 134) may determine that there is a fault in the relay 208 if the grid voltage, G, at the first contact 302 is different from the pole voltage, P, at the pole 300 at a time when the first contact 302 is connected to an external power source (e.g., the external power source 190), such as when the vehicle 100 is plugged in via the charging port 130 and a grid voltage is therefore non-zero. For example, in this use case, the switching mechanism that is intended to be coupled (308) to the first contact 302, to couple to pole 300 (e.g., common terminal) to the first contact 302, may instead be shorted (e.g., welded) to the second contact 304 such that the common terminal is shorted to the second contact 304 (e.g., the I terminal), as illustrated in FIG. 3B.

Returning to the example of FIG. 3A, in another use case, the control circuitry may determine that the grid voltage, G, is the same as the voltage, P (e.g., a zero voltage, or the same voltage as the voltage received from an external power source, such as the electrical grid when the relay is exercised toward the grid). However, a measurement of a zero grid voltage, G, and pole voltage, P, may be insufficient for determining that the relay 208 is healthy. This is because, even when the grid voltage, G, and pole voltage, P, are the same, (a) the switching mechanism 306 may be shorted (e.g., welded) to the first contact 302, or (b) the grid voltage, G, at the first contact 302 may be zero (e.g., because the first contact 302 is decoupled from the electrical grid (e.g., the vehicle 100 is unplugged) and the pole voltage, P, may also be zero and the switching mechanism 306 may be shorted to the second contact 304 (as in the example of FIG. 3B), either of which would be a fault in the relay 208.

Figure 4A:
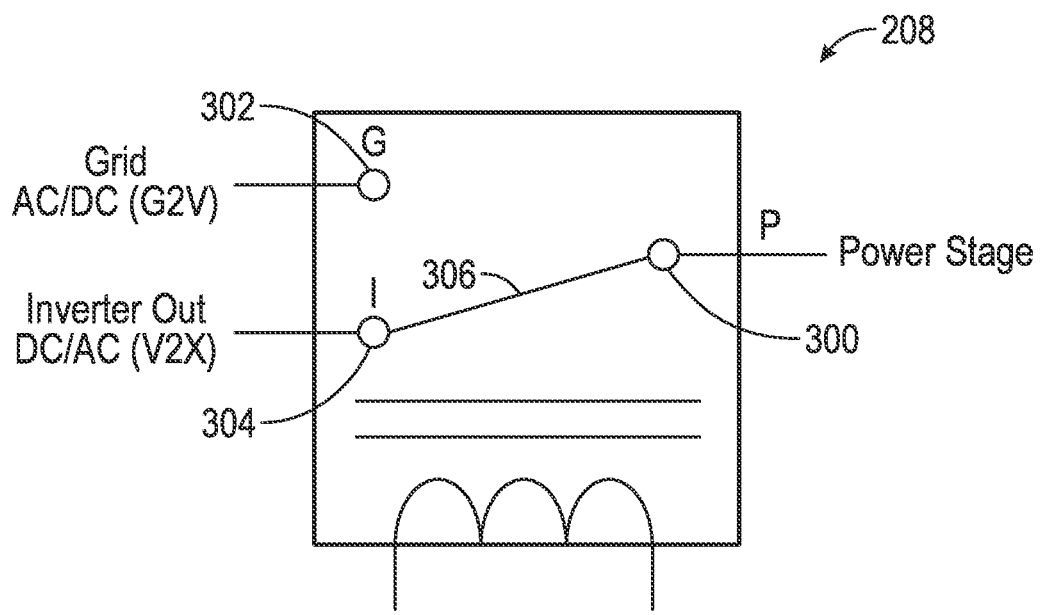
FIG. 4A illustrates a schematic diagram of the example relay of FIG. 3A in a second configuration for relay monitoring in accordance with one or more implementations.
Figure 4B:
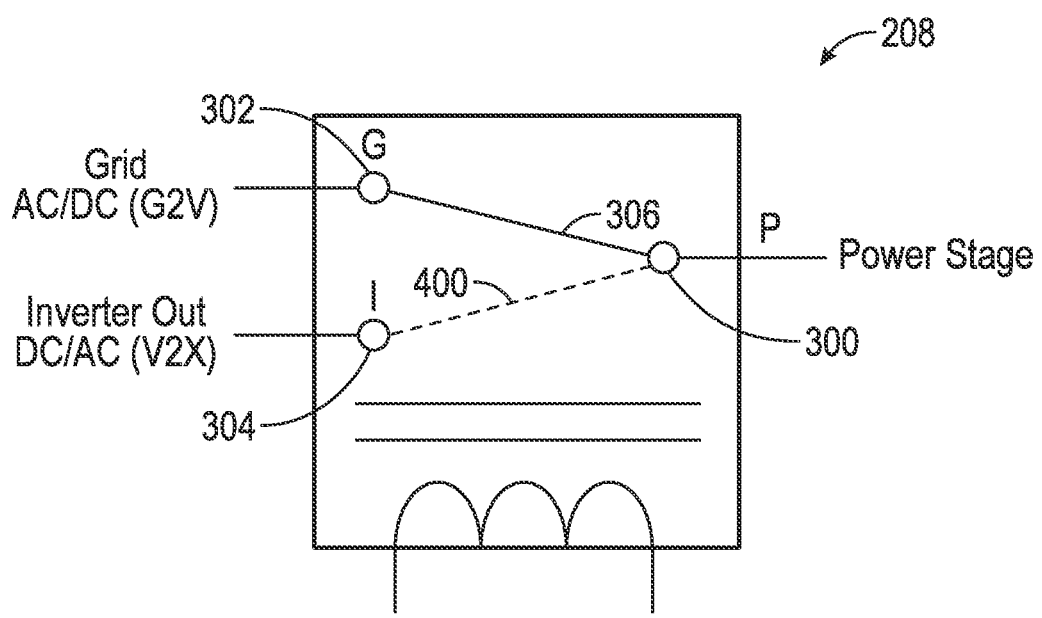
FIG. 4B illustrates a schematic diagram of the example relay of FIG. 4A in a fault state in accordance with one or more implementations.

In one or more implementations, the control circuitry may perform further operations for ruling out the fault conditions (a) and (b) above. For example, the control circuitry may exercise the relay 208 towards inverter output (e.g., by actuating the switching mechanism 306 into contact with the second contact 304) as shown in FIG. 4A. In this configuration in which the switching mechanism 306 is intended to be coupled with the second contact 304 (and to couple the second contact 304 to the pole 300), if the control circuitry determines that the grid voltage, G, and pole voltage, P, are still the same and non-zero (e.g., and the same as the voltage received from the electrical grid when the grid is connected), the control circuitry may determine that the relay 208 has a fault (e.g., because the switching mechanism 306 is shorted, or welded, to the first contact 302, as illustrated in FIG. 4B, when the switching mechanism is intended to couple (400) to the second contact 304).

In a configuration in which the switching mechanism 306 is intended to be in contact with the second contact 304 and to couple the second contact 304 to the pole 300 (as in FIG. 4A), if the control circuitry determines that the grid voltage, G, and pole voltage, P, are different or measure zero voltage if the grid is disconnected, this may indicate that either (i) the switching mechanism 306 is correctly connected to the second contact 304 as intended and the relay 208 is healthy, or (ii), the switching mechanism 306 is shorted (e.g., welded) to the first contact 302 when the grid is disconnected (e.g., as in the example of FIG. 4B), which is a fault state of the relay 208. In this circumstance, additional operations may be performed for diagnostics In one or more implementations, the control circuitry may perform further operations for distinguishing between the conditions (i) and (ii) above. For example, while the relay 208 is intended to be in the configuration shown in FIG. 4A, the control circuitry may generate an inverter output, by DC to AC conversion from V2X power stages, at the second contact 304 when the switching mechanism 306 is coupled to the second contact 304. In this configuration in which the relay 208 is intended to be in the configuration shown in FIG. 4A and the control circuitry generates an inverter output at the second contact 304, if the inverter voltage, I, is the same as the pole voltage, P, the control circuitry may determine that the relay is healthy (e.g., that the relay is in the intended configuration of FIG. 4A, and is free of faults). In this configuration in which the relay 208 is intended to be in the configuration shown in FIG. 4A and the control circuitry generates an inverter output at the second contact 304, if the inverter voltage, I, is different from the pole voltage, P, the control circuitry may determine that the relay has a fault (e.g., that the relay is in the configuration of FIG. 4B, in which the switching mechanism 306 is intended to be coupled (400) to second contact 304, but is instead shorted or welded to the first contact 302).

In a use case in which the control circuitry determines that there is a fault in the relay 208, the control circuitry may prevent operation of some or all of the electrical system 200. For example, if the control circuitry determines that the relay 208 is in the fault state of FIG. 3B, the control circuitry may prevent energizing of the G2V circuitry 214 (e.g., and thereby prevent on-board charging) and the V2X circuitry of the V2X/G2V circuitry 215 (e.g., and thereby prevent output to the load terminals 204). As another example, if the control circuitry determines that the relay 208 is in the fault state of FIG. 4B, the control circuitry may prevent energizing of the V2X circuitry of the V2X/G2V circuitry 215 (e.g., and thereby prevent output to the load terminals 204), and/or may energize the G2V circuitry 214 only if no other relay is shorted to the second contact 304 of that relay (e.g., no other relay is shorted to the inverter (V2X) side). In this other example, the control circuitry may exercise all SPTD relays of the electrical system 200 to their respective first contacts 302 before energizing the G2V circuitry 214.

Figure 5:
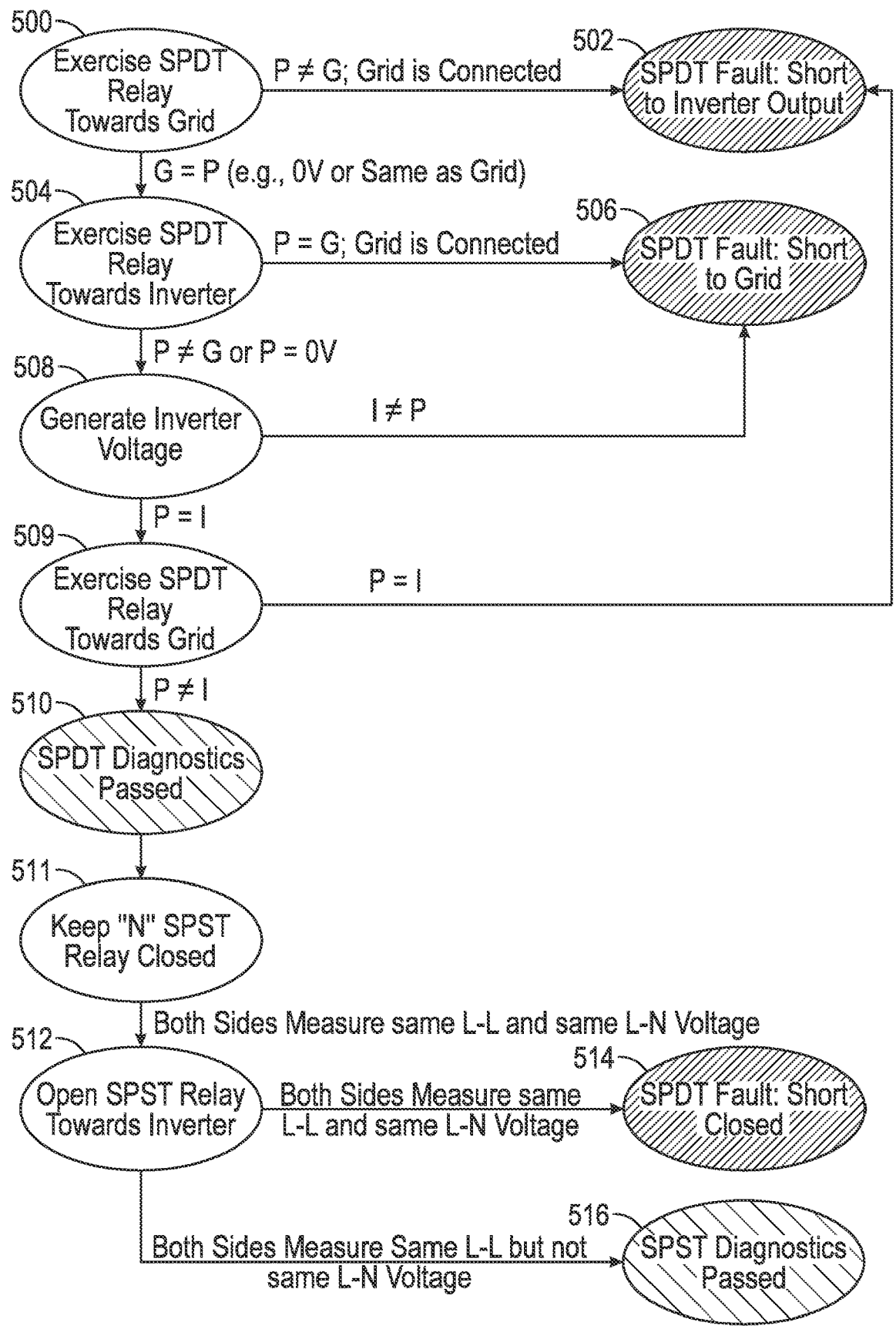
FIG. 5 illustrates a flow diagram of an example process for relay monitoring in accordance with one or more implementations.

FIG. 5 illustrates a flow diagram of an example process for relay monitoring in accordance with one or more implementations. As shown in FIG. 5, control circuitry (e.g., control circuitry 134) of an electrical system (e.g., electrical system 200) of an apparatus (e.g., vehicle 100 or building 180) may exercise (500) an SPDT relay (e.g., a relay 208 or a relay 210 as described herein) toward a contact (e.g., the first contact 302) that is configured for coupling to an electrical grid (e.g., by actuating the switching mechanism 306 of the relay to a first contact 302 that is coupled to a power source terminal 202, as in the configuration of FIG. 3A). In this configuration, if the grid voltage, G, is different from the pole voltage, P, and the electrical grid is connected to the electrical system, the control circuitry may identify (502) a fault (e.g., an SPDT fault, such as the fault illustrated in FIG. 3B, in which the switching mechanism 306 is shorted/welded to the second contact 304). If, in this configuration, the grid voltage, G, is the same as the pole voltage, P (e.g., both G and P are equal to zero or G and P are equal to the voltage of the electrical grid), the control circuitry may exercise (504) the SPDT relay to an inverter side contact of the SPDT relay (e.g., by actuating the switching mechanism 306 of the relay to a second contact 304 that is coupled to a load terminal 204, as in the configuration of FIG. 4A).

In this configuration with the SPDT relay exercised to the inverter side, if the grid voltage, G, is the same as the pole voltage, P, and the electrical grid is connected to the electrical system, the control circuitry may identify (506) a fault (e.g., an SPDT fault, such as the fault illustrated in FIG. 4B, in which the switching mechanism 306 is shorted/welded to the first contact 302). If, in this configuration with the SPDT relay exercised to the inverter side, the grid voltage, G, is different from the pole voltage, P, or if the pole voltage, P, is zero, the control circuitry may generate (508) an inverter voltage at an inverter side contact of the SPDT relay (e.g., at the second contact 304 that is coupled to a load terminal 204).

If, while the inverter voltage is present at the inverter side contact of the SPDT relay (e.g., and while an inverter voltage is generated), the inverter voltage, I, is different from the pole voltage, P, the control circuitry may identify (506) a fault (e.g., an SPDT fault, such as the fault illustrated in FIG. 4B, in which the switching mechanism 306 is shorted/welded to the first contact 302). If, while the inverter voltage is present at the inverter side contact of the SPDT relay, the inverter voltage, I, is the same as the pole voltage, P, the control circuitry may again exercise (509) the SPDT relay toward the contact (e.g., the first contact 302) that is configured for coupling to the electrical grid (e.g., by actuating the switching mechanism 306 of the relay to the first contact 302 that is coupled to a power source terminal 202, as in the configuration of FIG. 3A). As shown in FIG. 5, in this configuration, with the inverter voltage generated and the relay exercised to toward the grid, if the inverter voltage, I, is the same as the pole voltage, P, the control circuitry may identify (502) a fault (e.g., an SPDT fault, such as the fault illustrated in FIG. 3B, in which the switching mechanism 306 is shorted/welded to the second contact 304). In this configuration, with the inverter voltage generated and the relay exercised to toward the grid, if the inverter voltage, I, is different from the pole voltage, P, the control circuitry may determine (510) that SPDT diagnostics have passed for this SPDT relay (e.g., that the SPDT relay is healthy and does not have a fault). The process illustrated for the SPDT relay in FIG. 5 may be performed for one or multiple (e.g., all) SPDT relays in an electrical system (e.g., concurrently or in series).

As shown in FIG. 5, aspects of the subject technology may also provide for monitoring the health of relays other than SPDT relays, including SPST relays. For example, as shown in FIG. 5, control circuitry of, or for, an electrical system, such as the electrical system 200, may keep (511) an "N" SPST relay (e.g., a relay 212 of FIG. 2 having a pole that is coupled to the power electronics of the electrical system 200, having an open contact configuration, and having a closed contact configuration in which the pole of the relay 212 is connected, to a closed contact of the relay 212 that is coupled to the load terminal 204). In this configuration, if the line-line (L-L) voltage and the line-neutral (L-N) voltage on both sides of the SPST relay are the same when the SPST relay is intended to be closed, the control circuitry may open (512) the SPST relay and measure one or more voltages on each side of the SPST relay (e.g., at the pole and at the contact of the SPST relay). As shown in FIG. 5, if the line-line (L-L) voltage and the line-neutral (L-N) voltage on both sides of the SPST relay are the same when the SPST relay is intended to be open, the control circuitry may determine (514) that the SPST relay has a fault (e.g., is welded closed). As shown in FIG. 5, if the line-line (L-L) voltage is the same on both sides of the SPST relay but the line-neutral (L-N) voltage is different on the two sides of the SPST relay while the SPST relay is intended to be open, the control circuitry may determine (516) that SPST diagnostics have passed for this SPST relay (e.g., that the SPST relay is healthy and does not have a fault).

Figure 6:
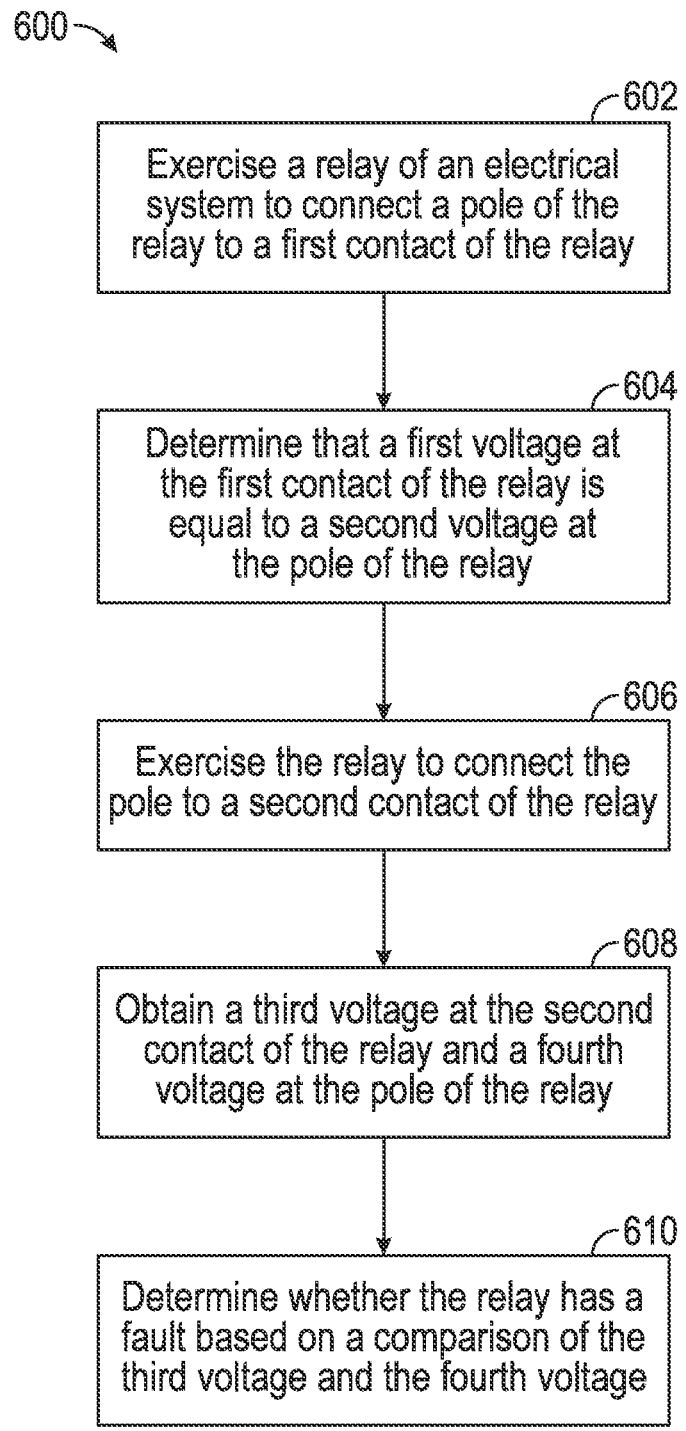
FIG. 6 illustrates a flow chart of example operations that may be performed for relay monitoring in accordance with implementations of the subject technology.

FIG. 6 illustrates a flow diagram of an example process 600 that may be performed for relay monitoring for electrical systems, in accordance with implementations of the subject technology. For explanatory purposes, the process 600 is primarily described herein with reference to the electrical system 200 of FIG. 2. However, the process 600 is not limited to the electrical system 200 of FIG. 2, and one or more blocks (or operations) of the process 600 may be performed by one or more other components of other suitable apparatuses, moveable apparatuses, devices, and/or systems. Further for explanatory purposes, some of the blocks of the process 600 are described herein as occurring in serial, or linearly. However, multiple blocks of the process 600 may occur in parallel. In addition, the blocks of the process 600 need not be performed in the order shown and/or one or more blocks of the process 600 need not be performed and/or can be replaced by other operations.

As illustrated in FIG. 6, at block 602, a relay (e.g., a relay 208 or a relay 210, such as an SPDT relay) of an electrical system (e.g., electrical system 200) may be exercised (e.g., by control circuitry for the electrical system, such as control circuitry 134 of FIG. 1) to connect a pole (e.g., pole 300) of the relay to a first contact (e.g., first contact 302) of the relay. For example, exercising the relay to connect the pole to the first contact may include actuating a switching mechanism (e.g., the switching mechanism 306) of the relay into contact with the first contact. In one or more implementations, the pole may be coupled to power electronics (e.g., V2X/G2V circuitry 215) of the electrical system. In one or more implementations, the first contact may be coupled to a power source terminal (e.g., power source terminal 202) of the electrical system. For example, the power source terminal may be coupled to a power source (e.g., external power source 190) external to an apparatus (e.g., vehicle 100 or building 180) that incorporates the electrical system and the relay. For example, the power source external to the apparatus may be an electrical grid. In one or more implementations, the power source terminal may include or be connected to a charging port 130 of an electric vehicle.

At block 604, a first voltage (e.g., G) on a first side of the relay (e.g., at the first contact) may be determined (e.g., by the control circuitry, such as while the relay is exercised to connect the pole to the first contact) to be equal to a second voltage (e.g., P) on a second side of the relay (e.g., at the pole of the relay). For example, the control circuitry may measure the first voltage at the first contact of the relay (e.g., by measuring the voltage at a location 250), measure a second voltage at the pole of the relay (e.g., by measuring the voltage at a location 256, 258, 260, or 262), and compare the first voltage to the second voltage. In the example of block 604, the comparison may indicate that the first voltage and the second voltage are substantially the same (e.g., as in the configuration of FIG. 3A). In one or more other use cases, the control circuitry may identify (e.g., while the relay is exercised to connect the pole to the first contact) a fault in the relay by determining that the first voltage at the first contact 302 of the relay is different from the second voltage at the pole 300 of the relay. For example, determining that the first voltage at the first contact 302 of the relay is different from the second voltage at the pole 300 of the relay may indicate that a switching mechanism (e.g., the switching mechanism 306) of the relay is welded to a different contact than the first contact (e.g., as in the example of FIG. 3B).

At block 606, the relay may be exercised (e.g., by the control circuitry) to connect the pole to a second contact (e.g., second contact 304) of the relay. For example, exercising the relay to connect the pole to the second contact may include actuating a switching mechanism (e.g., the switching mechanism 306) to disconnect from the first contact and to connect to the second contact. For example, the second contact may be coupled to a load terminal (e.g., load terminal 204) of the electrical system. In one or more implementations, the load terminal may include, or be connected to, an electrical outlet (e.g., an electrical outlet 132). In one or more implementations, the load terminal may be coupled or couplable to one or more electrical loads, such as electronic components and/or devices that consume electrical power.

At block 608, a third voltage (e.g., I) on the first side of the relay (e.g., an inverter voltage at the second contact 304) and a fourth voltage (e.g., P) on the second side of the relay (e.g., a pole voltage at the pole 300) may be obtained (e.g., measured, by the control circuitry). For example, the control circuitry may measure the third voltage at the second contact 304 of the relay (e.g., by measuring the voltage at the location 252 or 254) and measure the fourth voltage at the pole 300 of the relay (e.g., by measuring the voltage at a location 256, 258, 260, or 262). In one or more implementations, a voltage (e.g., an inverter voltage) may be generated (e.g., by the control circuitry, such as if the first voltage and the second voltage are different, and/or if the second voltage is substantially zero volts) on the first side of the relay (e.g., at the second contact) prior to obtaining the third voltage and the fourth voltage. The third voltage and the second voltage may be measured while the relay is exercised to connect the pole to the second contact, and while the inverter voltage is generated.

At block 610, the control circuitry may determine whether the relay has a fault based on a comparison of the third voltage and the fourth voltage. In one example use case, determining whether the relay has the fault may include determining, based on the comparison, that the third voltage is different from the fourth voltage (e.g., while the relay is exercised to connect the pole to the second contact and while the inverter voltage is generated); and determining that the relay has the fault based on the determination that the third voltage is different from the fourth voltage (e.g., as in the example of FIG. 4B). In this example use case, the control circuitry may also provide a notification (e.g., an audio notification, a visual notification, or the like) responsive to determining that the relay has the fault based on the comparison of the third voltage and the fourth voltage. In this example use case, the control circuitry may prevent energizing of V2X circuitry in the electrical system. In this example use case, the control circuitry may only energize G2V circuitry of the electrical system if no other relay is shorted to the V2X side of that relay.

In another example use case, determining whether the relay has a fault may include determining, based on the comparison, that the third voltage is substantially the same as the fourth voltage (e.g., while the relay is exercised to connect the pole to the second contact and while the inverter voltage is connected, as in the example of FIG. 4A); exercising (e.g., 509) the relay to again connect the pole to the first contact; obtaining an updated third voltage (e.g., I) and an updated fourth voltage (e.g., P) while the pole is again connected to the first contact (e.g., and while the inverter voltage is being generated); and determining (e.g., 510) that the relay is healthy based on a determination that the updated third voltage is different from the updated fourth voltage (e.g., while the relay is exercised to connect the pole to the first contact and while the inverter voltage is generated). In this other example use case, the control circuitry may allow energizing of G2V or V2X circuitry in the electrical system. For example, the control circuitry may provide power from a battery (e.g., battery 110 and/or power storage device 230) to a load terminal (e.g., load terminal 204) of the electrical system via the relay responsive to determining that the relay is healthy.

In one or more implementations, the process 600 may also include opening (e.g., 512) at least one additional relay (e.g., a relay 212, such as a SPST relay) of the electrical system. For example, the at least one additional relay may have a pole coupled to the power electronics of the electrical system (e.g., as shown in FIG. 2). The process 600 may also include determining (e.g., by the control circuitry, such as while the at least one additional relay is open) whether the at least one additional relay has a fault based on a comparison of a fifth voltage (e.g., a L-N voltage) at a pole of the at least one additional relay and a sixth voltage (e.g., a L-N voltage) at a contact of the at least one additional relay. For example, the contact of the at least one additional relay may be coupled to the load terminal (e.g., load terminal 204) of the electrical system (e.g., as shown in FIG. 2). In one or more implementations, the control circuitry may, prior to opening the at least one additional relay, keep (e.g., 511) the at least one additional relay closed, and determine that a L-L voltage at a pole of the at least one additional relay and a L-L voltage at a contact of the at least one additional relay are substantially the same.

In one example use case, determining whether the at least one additional relay has a fault may include determining, while the at least one additional relay is open, that the fifth voltage is substantially the same as the sixth voltage; and determining (e.g., 514) that the at least one additional relay has the fault based on the determination that the fifth voltage is substantially the same as the sixth voltage (e.g., as described herein in connection with FIG. 5). In another example use case, determining whether the at least one additional relay has the fault may also include determining, while the at least one additional relay is open, that the fifth voltage is different from the sixth voltage; and determining (e.g., 516) that the at least one additional relay is healthy based on the determination that the fifth voltage is different from the sixth voltage (e.g., as described herein in connection with FIG. 5).

In one or more implementations, the process 600 may also include determining whether the at least one additional relay has the fault based on a comparison (e.g., while the at least one additional relay is open and/or while the at least one additional relay is closed) of a seventh voltage (e.g., a L-L voltage) at the pole of the at least one additional relay and an eighth voltage (e.g., a L-L voltage) at the contact of the at least one additional relay. For example, the comparison of the seventh voltage and the eighth voltage may be performed while the relay is exercised to the second contact of the relay.

Aspects of the subject technology can help improve the reliability of electrical systems that include relays. This can help facilitate the functioning of and/or proliferation of electric vehicles, which can positively impact the climate by reducing greenhouse gas emissions.

Figure 7:
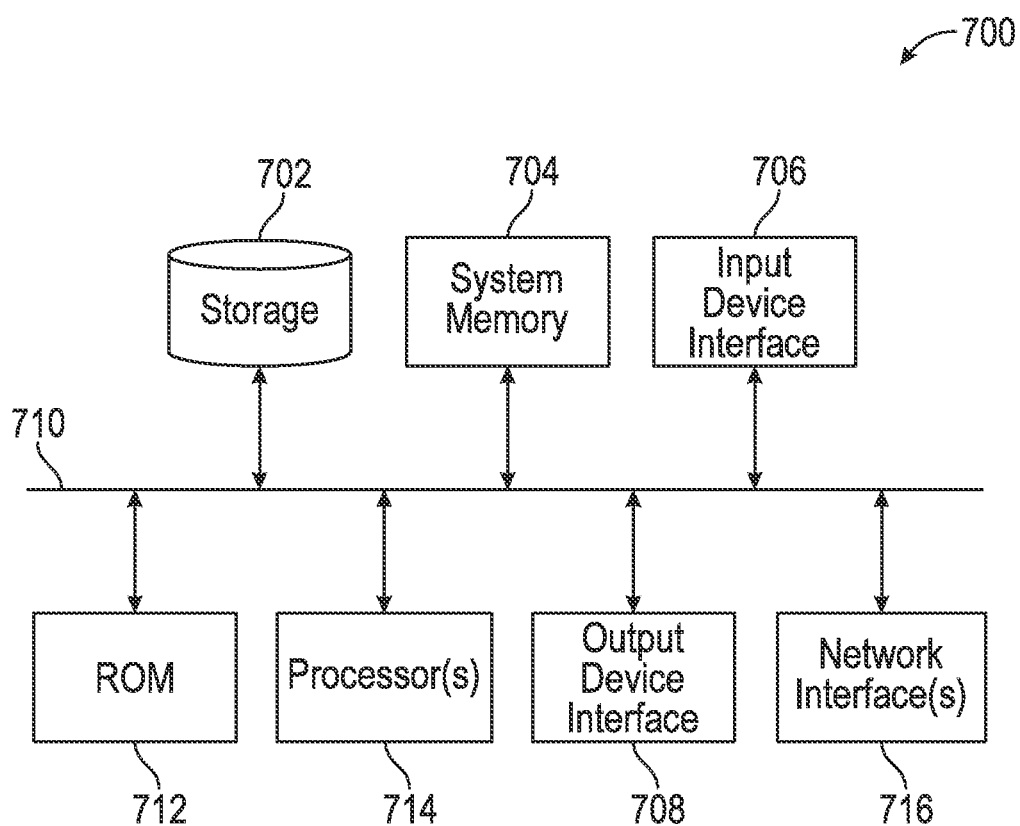
FIG. 7 illustrates an example computing system with which aspects of this disclosure may implemented.

FIG. 7 illustrates an example computing system 700 with which aspects of the subject technology may be implemented in accordance with one or more implementations. The computing system 700 can be, and/or can be a part of, any computing device or apparatus for generating the features and processes described above, including but not limited to control circuitry for a vehicle, control circuitry for a building, and the like. The computing system 700 may include various types of computer readable media and interfaces for various other types of computer readable media. The computing system 700 includes a permanent storage device 702, a system memory 704 (and/or buffer), an input device interface 706, an output device interface 708, a bus 710, a ROM 712, one or more processing unit(s) 714, one or more network interface(s) 716, and/or subsets and variations thereof.

The bus 710 collectively represents all system, peripheral, and chipset buses that communicatively connect the numerous internal devices of the computing system 700. In one or more implementations, the bus 710 communicatively connects the one or more processing unit(s) 714 with the ROM 712, the system memory 704, and the permanent storage device 702. From these various memory units, the one or more processing unit(s) 714 retrieves instructions to execute and data to process in order to execute the processes of the subject disclosure. The one or more processing unit(s) 714 can be a single processor or a multi-core processor in different implementations.

The ROM 712 stores static data and instructions that are needed by the one or more processing unit(s) 714 and other modules of the computing system 700. The permanent storage device 702, on the other hand, may be a read-and-write memory device. The permanent storage device 702 may be a non-volatile memory unit that stores instructions and data even when the computing system 700 is off. In one or more implementations, a mass-storage device (such as a magnetic or optical disk and its corresponding disk drive) may be used as the permanent storage device 702.

In one or more implementations, a removable storage device (such as a floppy disk, flash drive, and its corresponding disk drive) may be used as the permanent storage device 702. Like the permanent storage device 702, the system memory 704 may be a read-and-write memory device. However, unlike the permanent storage device 702, the system memory 704 may be a volatile read-and-write memory, such as random-access memory. The system memory 704 may store any of the instructions and data that one or more processing unit(s) 714 may need at runtime. In one or more implementations, the processes of the subject disclosure are stored in the system memory 704, the permanent storage device 702, and/or the ROM 712. From these various memory units, the one or more processing unit(s) 714 retrieves instructions to execute and data to process in order to execute the processes of one or more implementations.

The bus 710 also connects to the input and output device interfaces 706 and 708. The input device interface 706 enables a user to communicate information and select commands to the computing system 700. Input devices that may be used with the input device interface 706 may include, for example, alphanumeric keyboards and pointing devices (also called "cursor control devices"). The output device interface 708 may enable, for example, the display of images generated by computing system 700. Output devices that may be used with the output device interface 708 may include, for example, printers and display devices, such as a liquid crystal display (LCD), a light emitting diode (LED) display, an organic light emitting diode (OLED) display, a flexible display, a flat panel display, a solid state display, a projector, or any other device for outputting information.

One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 7, the bus 710 also couples the computing system 700 to one or more networks and/or to one or more network nodes through the one or more network interface(s) 716. In this manner, the computing system 700 can be a part of a network of computers (such as a LAN, a wide area network ("WAN"), or an Intranet, or a network of networks, such as the Internet. Any or all components of the computing system 700 can be used in conjunction with the subject disclosure.

Implementations within the scope of the present disclosure can be partially or entirely realized using a tangible computer-readable storage medium (or multiple tangible computer-readable storage media of one or more types) encoding one or more instructions. The tangible computer-readable storage medium also can be non-transitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM, and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, racetrack memory, FJG, and Millipede memory.

Further, the computer-readable storage medium can include any non-semiconductor memory, such as optical disk storage, magnetic disk storage, magnetic tape, other magnetic storage devices, or any other medium capable of storing one or more instructions. In one or more implementations, the tangible computer-readable storage medium can be directly coupled to a computing device, while in other implementations, the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence, and organization of instructions can vary significantly without varying the underlying logic, function, processing, and output.

While the above discussion primarily refers to microprocessor or multi-core processors that execute software, one or more implementations are performed by one or more integrated circuits, such as ASICs or FPGAs. In one or more implementations, such integrated circuits execute instructions that are stored on the circuit itself.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the implementations described above should not be understood as requiring such separation in all implementations, and it should be understood that the described program components (e.g., computer program products) and systems can generally be integrated together in a single software product or packaged into multiple software products.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as an aspect, the aspect, another aspect, some aspects, one or more aspects, an implementation, the implementation, another implementation, some implementations, one or more implementations, an embodiment, the embodiment, another embodiment, some implementations, one or more implementations, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration". Any embodiment described herein as "exemplary" or as an "example" is not necessarily to be construed as preferred or advantageous over other implementations. Furthermore, to the extent that the term "include", "have", or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for".

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more". Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language of the claims and to encompass all legal equivalents. Notwithstanding, none of the claims are intended to embrace subject matter that fails to satisfy the requirements of the applicable patent law, nor should they be interpreted in such a way.

What is claimed is:

1. An apparatus, comprising:
   an electrical system, comprising:
      a relay having a pole that is coupled to power electronics of the apparatus and that is switchably couplable to:
      a first contact that is coupled to a power source terminal, and
      a second contact that is coupled to a load terminal; and
      control circuitry configured to, prior to energizing the power electronics:
         exercise the relay to connect the pole to the first contact;
         determine that a first voltage at the first contact of the relay is equal to a second voltage at the pole of the relay;
         exercise the relay to connect the pole to the second contact;
         obtain a third voltage at the second contact of the relay and a fourth voltage at the pole of the relay; and
         determine whether the relay has a fault based on a comparison of the third voltage and the fourth voltage.

2. The apparatus of claim 1, wherein the power source terminal is coupled to a power source external to the apparatus.

3. The apparatus of claim 2, wherein the power source external to the apparatus comprises an electrical grid.

4. The apparatus of claim 3, wherein the load terminal comprises an electrical outlet.

5. The apparatus of claim 4, wherein the apparatus comprises a vehicle.

6. The apparatus of claim 1, wherein the control circuitry is configured to determine whether the relay has a fault by:
   determining, based on the comparison, that the third voltage is different from the fourth voltage; and
   determining that the relay has the fault based on the determination that the third voltage is different from the fourth voltage.

7. The apparatus of claim 1, wherein the control circuitry is configured to determine whether the relay has a fault by:
   determining, based on the comparison, that the third voltage is substantially the same as the fourth voltage;
   exercising the relay to again connect the pole to the first contact;
   obtaining an updated third voltage and an updated fourth voltage while the pole is again connected to the first contact; and
   determining that the relay is healthy based on a determination that the updated third voltage is different from the updated fourth voltage.

8. The apparatus of claim 1, further comprising at least one additional relay having a pole coupled to the power electronics, wherein the at least one additional relay is switchable between:
   an open position, and
   a closed position in which the pole is connected to a contact of the at least one additional relay, wherein the contact of the at least one additional relay is coupled to the load terminal,
   wherein the control circuitry is further configured to:
   open the at least one additional relay; and
   determine whether the at least one additional relay has a fault based on a comparison of a fifth voltage at the pole of the at least one additional relay and a sixth voltage at the contact of the at least one additional relay.

9. The apparatus of claim 8, wherein the control circuitry is configured to determine whether the at least one additional relay has a fault by:
   determining, while the at least one additional relay is open, that the fifth voltage is substantially the same as the sixth voltage; and
   determining that the at least one additional relay has the fault based on the determination that the fifth voltage is substantially the same as the sixth voltage.

10. The apparatus of claim 8, wherein the control circuitry is configured to determine whether the at least one additional relay has a fault by:
    determining, while the at least one additional relay is open, that the fifth voltage is different from the sixth voltage; and
    determining that the at least one additional relay is healthy based on the determination that the fifth voltage is different from the sixth voltage.

11. The apparatus of claim 8, wherein the control circuitry is further configured to determine, while the at least one additional relay is open, whether the at least one additional relay has the fault based on a comparison of a seventh voltage at the pole of the at least one additional relay and an eighth voltage at the contact of the at least one additional relay, the comparison performed while the relay is exercised to the second contact of the relay.

12. A method, comprising:
    exercising a relay of an electrical system to connect a pole of the relay to a first contact of the relay, the pole of the relay coupled to power electronics of the electrical system; and
    prior to energizing the power electronics:
       determining that a first voltage at the first contact of the relay is equal to a second voltage at the pole of the relay;
       exercising the relay to connect the pole to a second contact of the relay;
       obtaining a third voltage at the second contact of the relay and a fourth voltage at the pole of the relay; and determining whether the relay has a fault based on a comparison of the third voltage and the fourth voltage.

13. The method of claim 12, wherein determining whether the relay has the fault comprises:
    determining, based on the comparison, that the third voltage is different from the fourth voltage; and
    determining that the relay has the fault based on the determination that the third voltage is different from the fourth voltage.

14. The method of claim 13, further comprising providing a notification responsive to determining that the relay has the fault based on the comparison of the third voltage and the fourth voltage.

15. The method of claim 12, determining whether the relay has a fault comprises:
    determining, based on the comparison, that the third voltage is substantially the same as the fourth voltage;
    exercising the relay to again connect the pole to the first contact;
    obtaining an updated third voltage and an updated fourth voltage while the pole is again connected to the first contact; and
    determining that the relay is healthy based on a determination that the updated third voltage is different from the updated fourth voltage.

16. The method of claim 15, further comprising providing power from a battery to a load terminal of the electrical system via the relay responsive to determining that the relay is healthy.

17. The method of claim 14, further comprising
    opening at least one additional relay of the electrical system; and
    determining whether the at least one additional relay has a fault based on a comparison of a fifth voltage at a pole of the at least one additional relay and a sixth voltage at a contact of the at least one additional relay.

18. The method of claim 17, further comprising determining whether the at least one additional relay has the fault based on a comparison of a seventh voltage at the pole of the at least one additional relay and an eighth voltage at the contact of the at least one additional relay, the comparison performed while the at least one additional relay is open and while the relay is exercised to the second contact of the relay.

19. An electric vehicle, comprising:
    a relay having a pole that is coupled to power electronics of the electric vehicle and that is switchably couplable to:
        a first contact that is coupled to a power source terminal, and
        a second contact that is coupled to a load terminal; and
    control circuitry configured to, prior to energizing the power electronics:
        exercise the relay to connect the pole to the first contact;
        determine that a first voltage at the first contact of the relay is equal to a second voltage at the pole of the relay;
        exercise the relay to connect the pole to the second contact;
        obtain a third voltage at the second contact of the relay and a fourth voltage at the pole of the relay; and
        determine whether the relay has a fault based on a comparison of the third voltage and the fourth voltage.

20. The electric vehicle of claim 19, wherein the power source terminal is coupled to a power source external to the electric vehicle, and wherein the load terminal comprises an electrical outlet of the electric vehicle.

* * * * *